(12) United States Patent
Kamgaing et al.

(10) Patent No.: US 12,424,719 B2
(45) Date of Patent: Sep. 23, 2025

(54) COMPACT SURFACE TRANSMISSION LINE WAVEGUIDES WITH VERTICAL GROUND PLANES

(71) Applicant: Intel Corporation, Santa Clara, CA (US)

(72) Inventors: Telesphor Kamgaing, Chandler, AZ (US); Neelam Prabhu Gaunkar, Chandler, AZ (US); Georgios C. Dogiamis, Chandler, AZ (US); Veronica Strong, Hillsboro, OR (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 952 days.

(21) Appl. No.: 17/350,791

(22) Filed: Jun. 17, 2021

(65) Prior Publication Data

US 2022/0407202 A1    Dec. 22, 2022

(51) Int. Cl.
| | |
|---|---|
| *H01P 3/00* | (2006.01) |
| *H01L 23/15* | (2006.01) |
| *H01L 23/498* | (2006.01) |
| *H01L 23/66* | (2006.01) |

(52) U.S. Cl.
CPC .............. *H01P 3/003* (2013.01); *H01L 23/15* (2013.01); *H01L 23/49827* (2013.01); *H01L 23/49838* (2013.01); *H01L 23/66* (2013.01); *H01L 2223/6616* (2013.01); *H01L 2223/6627* (2013.01)

(58) Field of Classification Search
CPC .... H01P 3/003; H01L 23/15; H01L 23/49827; H01L 23/19838; H01L 23/66; H01L 2223/6616; H01L 2223/6627
See application file for complete search history.

(56) References Cited

U.S. PATENT DOCUMENTS

| | | | |
|---|---|---|---|
| 2013/0220690 A1* | 8/2013 | Chang | H05K 1/0298 174/250 |
| 2018/0366416 A1* | 12/2018 | Wang | H01L 23/5385 |
| 2020/0161203 A1* | 5/2020 | Kim | H01L 23/49827 |

OTHER PUBLICATIONS

Machine English translation of JP H05275569, Nakazato et al., published Oct. 22, 1993.*

* cited by examiner

*Primary Examiner* — Peniel M Gumedzoe
(74) *Attorney, Agent, or Firm* — Schwabe, Williamson & Wyatt, P.C.

(57) ABSTRACT

Embodiments disclosed herein include coplanar waveguides and methods of forming coplanar waveguides. In an embodiment, a coplanar waveguide comprises a core, and a signal trace on the core. In an embodiment, the signal trace has a first edge and a second edge. In an embodiment, a first ground trace is over the core, and the first ground trace is adjacent to the first edge of the signal trace. In an embodiment, a first ground via plane is below the first ground trace. The coplanar waveguide may further comprise a second ground trace over the core, and the second ground trace is adjacent to the second edge of the signal trace. In an embodiment, a second ground via plane below the second ground trace.

24 Claims, 10 Drawing Sheets

COMPACT SURFACE TRANSMISSION LINE WAVEGUIDES WITH VERTICAL GROUND PLANES

TECHNICAL FIELD

Embodiments of the present disclosure relate to electronic packages, and more particularly to package substrates with a glass core with transmission line waveguides with vertical ground planes.

BACKGROUND

Coplanar waveguides are widely used for RF and high-speed signaling. In general, the signal and ground traces are formed on the same plane of the substrate. In such structures, the coplanar ground plane is usually large. This leads to a substantial large amount of packaging real estate dedicated to the coplanar waveguides. Additionally, the packages are limited to relatively low interconnect densities. On thick substrates, such as package cores and interposers, creating compact transmission lines (e.g. grounded coplanar waveguides, microstrips) is even more difficult because of the non-proximity of the ground or signal return path.

EMBODIMENTS OF THE PRESENT DISCLOSURE

Described herein are package substrates with a glass core with transmission line waveguides with vertical ground planes, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
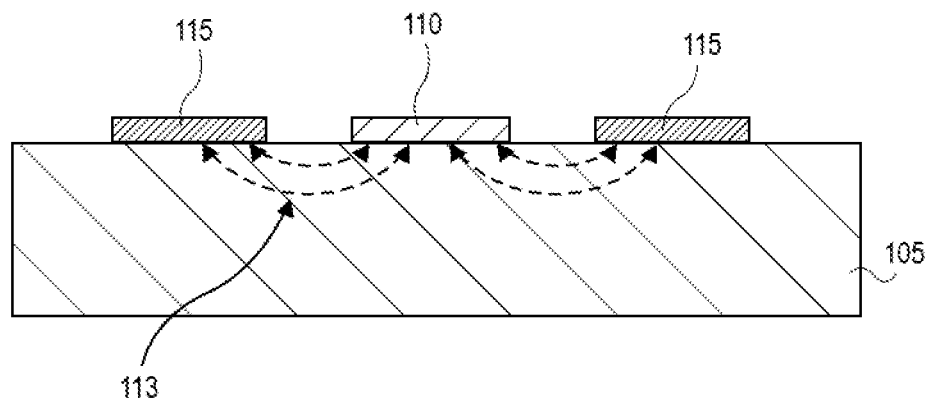
FIG. 1A is a cross-sectional illustration of a coplanar waveguide on a glass core.

As noted above, coplanar waveguides are used in many RF and high-speed signaling applications. However, currently available coplanar waveguide architectures are limited by the large amount of real estate they require which results in low density interconnects. For reference, an example of such a coplanar waveguide is shown in FIG. 1A. As shown, a pair of ground traces 115 are provided adjacent to a signal trace 110. As shown, an electric field 113 extends into the core 105 between the signal trace 110 and the ground traces 115. Small signal trace 110 to ground trace 115 spacing and wide ground traces 115 are needed to achieve high capacitance per unit length. High capacitance is needed in order to provide low impedances necessary for high-speed signaling.

Figure 1B:
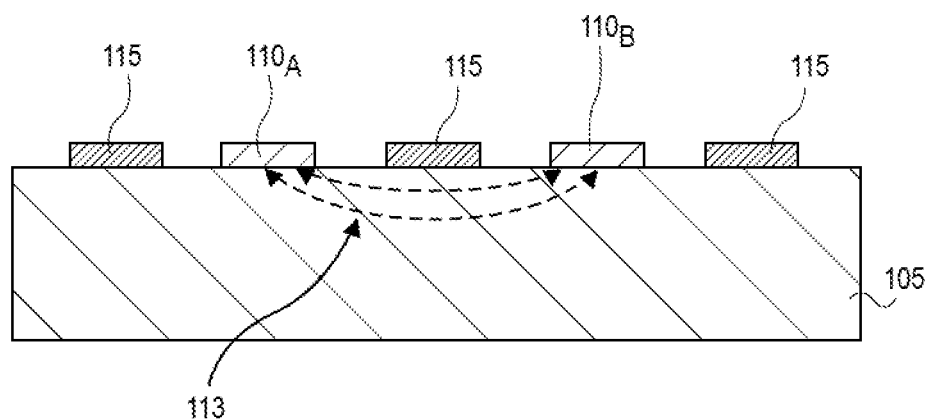
FIG. 1B is a cross-sectional illustration of a coplanar waveguide that illustrates cross-talk between signaling lines.

To provide additional context, FIG. 1B illustrates the case of multiple coplanar waveguide signal traces $110_A$ and $110_B$. Despite being separated from each other by a ground trace 115, an electric field 113 can still be generated between the signal trace $110_A$ and the signal trace $110_B$. This leads to cross-talk between the signal traces $110_A$ and $110_B$ and is undesirable. In order to minimize cross-talk, the width of the ground traces can be increased. However, this leads to even lower signal density.

Accordingly, embodiments disclosed herein comprise coplanar waveguides that include ground traces that are connected to via planes that are embedded in the core of the package substrate. The via planes extend into the core and block the electric field from passing between neighboring signal traces. In some embodiments, the via planes extend through an entire thickness of the core. In other embodiments, the via planes extend partially through a thickness of the core. In some embodiments, the coplanar waveguide is provided over a single surface of the core, and in other embodiments, coplanar waveguides are provided over both surfaces of the core.

In an embodiment, the via planes are fabricated using a laser-assisted etching process. The use of a laser-assisted etching process allows for the formation of vias that extend in a length direction. Instead of providing vias that have a length dimension and a width dimension that are substantially similar, embodiment allow for vias to have a length dimension that is substantially longer than the width dimension. In a particular embodiment, the length dimension is substantially equal to a length of the overlying ground trace.

Laser-assisted etching processes described herein generally consist of exposing a substrate to a laser source. The laser exposure results in a morphological change in the substrate. The morphologically changed exposed region has a different etch selectivity than the unexposed regions. An etching process is then used to remove the exposed regions. Conductive material (e.g., copper) can then be plated in the openings. The laser-assisted etching process provides flexibility in the depth of the exposure. For example, features may be formed through an entire thickness of the substrate, or features may be blind features formed partially through a thickness of the substrate.

Figure 2A:
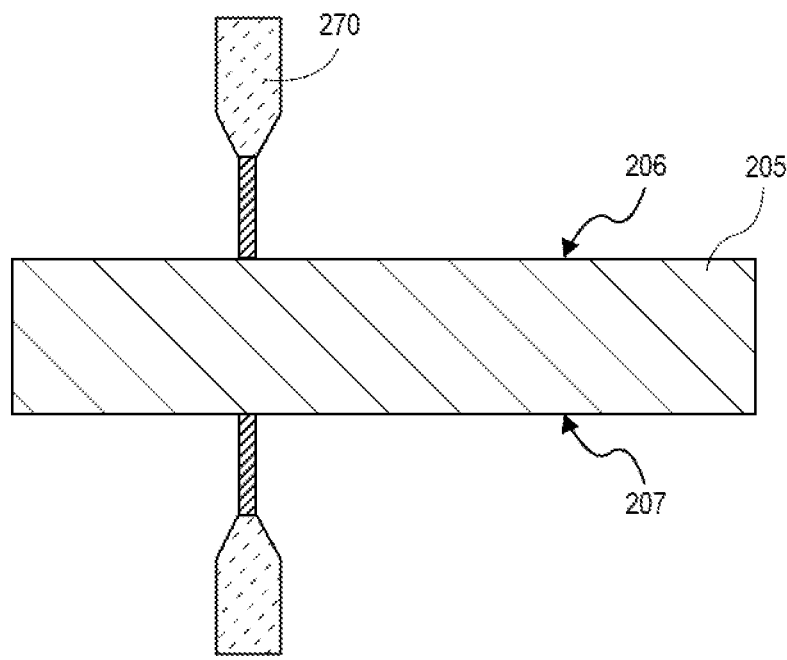
FIG. 2A is a cross-sectional illustration of a glass core with top and bottom surfaces that are being exposed with a laser, in accordance with an embodiment.

Referring now to FIGS. 2A-2D, a series of cross-sectional illustrations depicting a laser-assisted etching process to form features in a package core is shown, in accordance with an embodiment. The laser-assisted etching process may be used to form various features (e.g., ground via planes) described herein. As shown in FIG. 2A, the package core 205 is exposed by a laser 270. The laser 270 may be irradiated over both a first surface 206 and a second surface 207. However, the laser 270 may only irradiate a single surface of the package core 205 in other embodiments.

In an embodiment, the package core 205 may comprise a material that is capable of forming a morphological change as a result of the exposure by the laser 270. For example, in the case of a glass package core 205, the morphological change may result in the conversion of an amorphous crystal structure to a crystalline crystal structure. In an embodiment, the package core 205 may have a thickness between the first surface 206 and the second surface 207 that is between 100 μm and 1,000 μm. However, it is to be appreciated that larger or smaller thicknesses may also be used for the package core 205 in other embodiments.

Figure 2B:
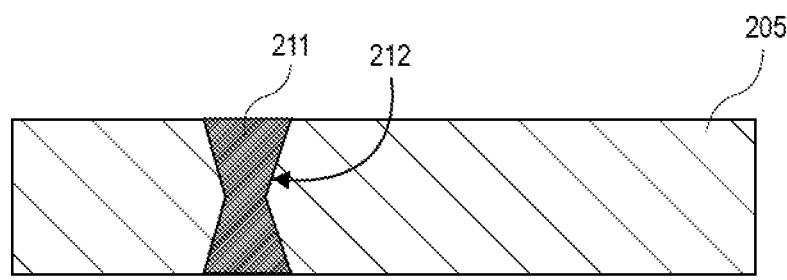
FIG. 2B is a cross-sectional illustration of the glass core with regions that have their morphology altered by the laser, in accordance with an embodiment.

Referring now to FIG. 2B, a cross-sectional illustration of the package core 205 after the morphological change has occurred is shown, in accordance with an embodiment. As shown, an exposed region 211 is provided through a thickness of the package core 205. In an embodiment, the exposed region 211 may have sidewalls 212 that are sloped. That is, the sidewalls 212 may not be substantially vertical (with respect to the first surface 206 and the second surface 207). In a particular embodiment, the exposed region 211 may have an hourglass shaped cross-section that results from exposure on both the first surface 206 and the second surface 207. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 212 may have a slope that is approximately 10° or less away from vertical. While shown with sloped sidewalls 212, it is also to be appreciated that embodiments may include substantially vertical sidewalls depending on the laser parameters and the material of the package core 205.

While shown as providing an exposed region 211 that passes through an entire thickness of the package core 205, it is to be appreciated that laser parameters may be modified in order to provide different structures. For example, a blind structure may be formed. A blind structure extends into, but not through, the package core 205. Furthermore, while shown as being substantially vertically oriented, the exposed region 211 may be at an angle with respect to a surface of the package core 205.

Figure 2C:
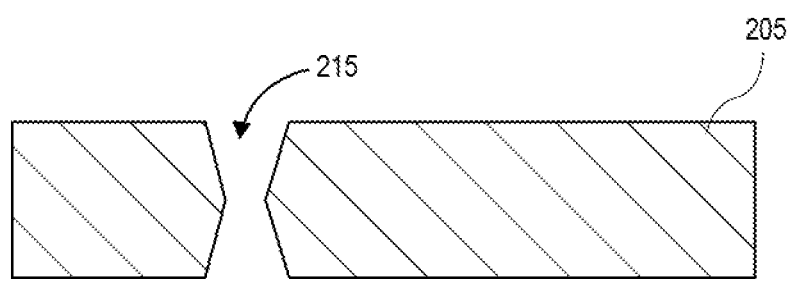
FIG. 2C is a cross-sectional illustration of the glass core with a via hole through a thickness of the glass core, in accordance with an embodiment.

Referring now to FIG. 2C, a cross-sectional illustration of the package core 205 after the exposed region 211 is removed to form a hole 215 through the package core 205 is shown, in accordance with an embodiment. In an embodiment, the hole 215 may be formed with an etching process that is selective to the exposed region 211 over the remainder of the package core 205. The etch selectivity of the exposed region 211 to the remainder of the package core 205 may be 10:1 or greater, or 50:1 or greater. That is, while selective to the exposed region 211, some portion of the package core 205 may also be etched, resulting in the thickness of the package core 205 being slightly reduced. In an embodiment, the etchant may be a wet etching chemistry.

Figure 2D:
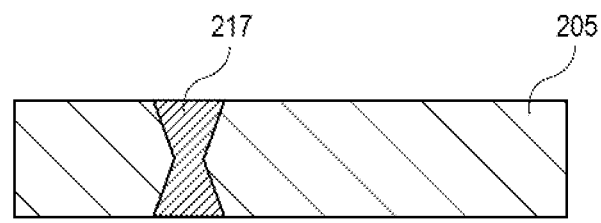
FIG. 2D is a cross-sectional illustration of the glass core with a via through the thickness of the glass core, in accordance with an embodiment.

Referring now to FIG. 2D, a cross-sectional illustration of the core substrate 205 after a via 217 is formed in the hole 215 is shown, in accordance with an embodiment. In an embodiment, the via 217 may be deposited with a plating process or any other suitable deposition process. In an embodiment, the hole 215 may have a maximum diameter that is approximately 100 μm or less, approximately 50 μm or less, or approximately 10 μm or less. The pitch between individual holes 215 in the package core 205 may be between approximately 10 μm and approximately 100 μm in some embodiments. The small diameters and pitch (compared to traditional plated through hole (PTH) vias that typically have diameters that are 100 μm or larger and pitches that are 100 μm or larger) allow for high density integration of vias.

In FIGS. 2A-2D only a single cross-section of the package core 205 is shown for simplicity. However, it is to be appreciated that the shape of the vias 217 may take substantially any form. This is because the laser providing the morphological change in the package core 205 may be moved in a controllable manner. Examples of various plan views of a via 317 in a package core 305 are shown in FIGS. 3A and 3B.

Figure 3A:
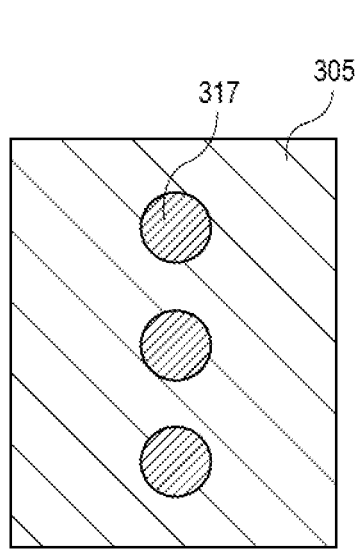
FIG. 3A is a plan view illustration of the glass core with a plurality of circular vias, in accordance with an embodiment.

Referring now to FIG. 3A, a plan view illustration of a package core 305 with a plurality of circular vias 317 is shown, in accordance with an embodiment. While three vias 317 are shown, it is to be appreciated that any number of vias 317 may be provided in any configuration.

Figure 3B:
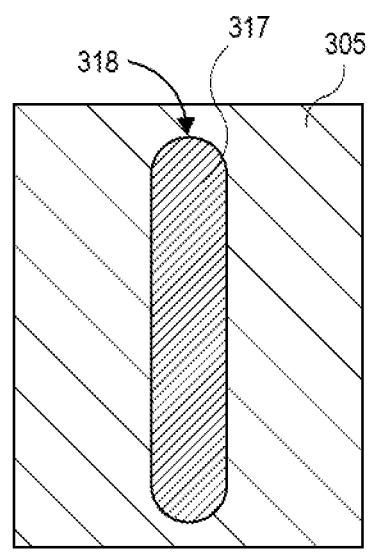
FIG. 3B is a plan view illustration of the glass core with a vertical via plane, in accordance with an embodiment.

Referring now to FIG. 3B, a plan view illustration of a package core 305 with a via 317 that is extended along one direction is shown, in accordance with an embodiment. Such a via 317 may be referred to herein as a "via plane" or simply a "plane". The via plane 317 may have a thickness through the package core 305 that is substantially uniform, while also being extended in a direction, as opposed to having a width and length that are substantially uniform. As shown in FIG. 3B, the ends of the via structure 317 may be rounded surfaces 318. The rounded surfaces may be the result of the shape of the laser irradiation. That is, the focus of the laser may be substantially circular in some embodiments. Via planes may be used to form features such as ground via planes, as will be described in greater detail below.

Figure 4A:
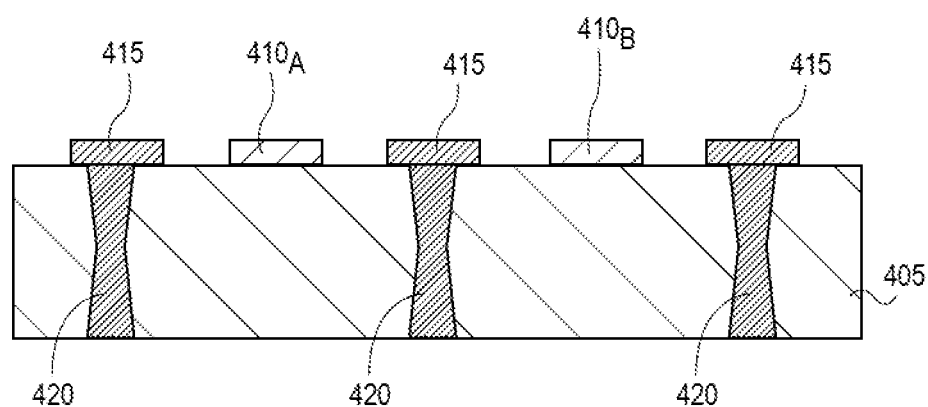
FIG. 4A is a cross-sectional illustration of a core with coplanar waveguides with ground traces that are connected to ground planes that extend through an entire thickness of the core, in accordance with an embodiment.

Referring now to FIG. 4A. a cross-sectional illustration of a core 405 is shown, in accordance with an embodiment. In an embodiment, the core 405 may be the core of a package substrate in an electronic package. While shown without buildup layers for simplicity, it is to be appreciated that buildup layers may be provided above and/or below the core 405. In an embodiment, the core 405 is a material that can be morphologically changed with a laser exposure process, such as the laser-assisted etching process described in greater detail above. For example, the core 405 may comprise glass. In an embodiment, the core 405 may have a thickness that is between approximately 100 µm and approximately 1,000 µm. Though, it is to be appreciated that larger or smaller thicknesses may be used for the core 405.

In an embodiment, coplanar waveguides are provided on a surface of the core 405. For example, a plurality of signal traces 410 and a plurality of ground traces 415 are on the top surface of the core 405. Signal traces 410 are alternated with ground traces 415. That is, a ground trace 415 is adjacent to each edge of an individual one of the signal traces 410. In the illustrated embodiment, a pair of signal traces $410_A$ and $410_B$ are shown, but it is to be appreciated that any number of signal traces 410 (and corresponding ground traces 415) may be included on a surface of the core 405. While shown with different shadings for clarity, it is to be appreciated that the signal traces 410 and the ground traces 415 may comprise the same material (e.g., copper). Additionally, while a single signal trace 410 is provided between two ground traces 415, it is to be appreciated that differential signaling architectures may also be included. In a differential signaling architecture, two signal traces 410 may be provided between two ground traces 415.

In an embodiment, vertically oriented via planes 420 are provided through a thickness of the core 405. Each of the via planes 420 may be provided below (and connected to) one of the plurality of ground traces 415. In an embodiment, the via planes 420 are provided through an entire thickness of the core 405. In an embodiment, the via planes 420 may have sidewalls that are sloped. In a particular embodiment, the via planes 420 may have cross-sections that are hourglass shaped, as is characteristic of laser-assisted etching processes described in greater detail above.

In an embodiment, the width of the ground traces 415 may be significantly smaller than allowed in existing coplanar waveguides. For example, the width of the ground traces 415 may be approximately 10 µm larger than a width of the via planes 420 (to allow for alignment tolerance). In a particular embodiment, the width of the via planes 420 may be less than approximately 50 µm, less than approximately 20 µm, or less than approximately 10 µm. Similarly, the width of the ground traces 415 and the signal traces 410 may be less than approximately 50 µm, less than approximately 20 µm, or less than approximately 10 µm. The width of the ground traces 415 can be significantly reduced because there is no longer a need to physically distance neighboring signal traces 410 because the via planes 420 block the spread of cross-talk inducing electromagnetic fields through the core 405. In addition to reducing cross-talk, the via planes 420 can increase the capacitance per unit length. As such impedances are reduced, even with relatively large signal to ground spacings.

Figure 4B:
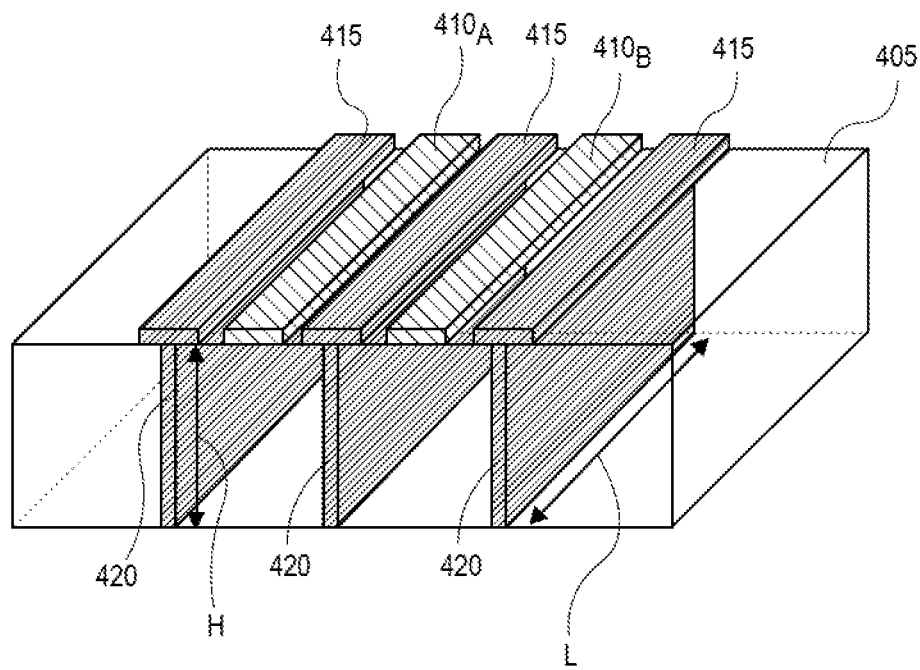
FIG. 4B is a perspective view illustration of the core in FIG. 4A that illustrates the ground planes extending substantially along a length of the ground traces, in accordance with an embodiment.

Referring now to FIG. 4B, a perspective view illustration of the core 405 is shown, in accordance with an embodiment. In FIG. 4B, sidewalls of the via planes 420 are shown as substantially vertical. However, it is to be appreciated that sidewalls of the via planes 420 may be sloped and/or the via planes 420 may have hourglass shaped cross-sections. The perspective view illustration more clearly depicts the length L of the via planes 420. The length L of the via planes 420 may be substantially equal to a length of the ground traces 415. That is, a continuous conductive via plane 420 is provided below each of the ground traces 415. Additionally, while straight lines are depicted in FIG. 4B, it is to be appreciated that turns along the ground trace 415 can be matched with turns in the via plane 420. The ability to provide such routing flexibility is provided by the laser-assisted etching process, since the laser can be moved in any pattern across the core 405.

As shown in FIG. 4B, the via planes 420 have a height H that is equal to a thickness of the core 405. However, it is to be appreciated that embodiments are not limited to such configurations. For example, FIGS. 5A and 5B depict a core 505 with via planes 520 that only extend partially through a thickness of the core 505.

Figure 5A:
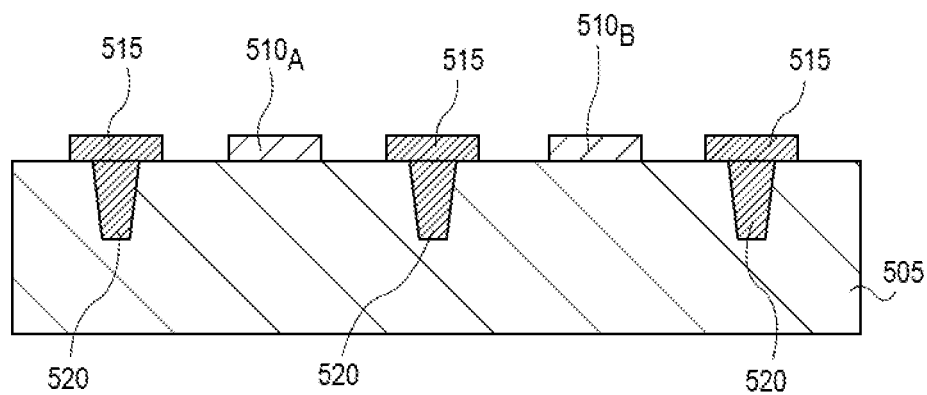
FIG. 5A is a cross-sectional illustration of a core with coplanar waveguides with ground traces that are connected to ground planes that extend partially through a thickness of the core, in accordance with an embodiment.
Figure 5B:
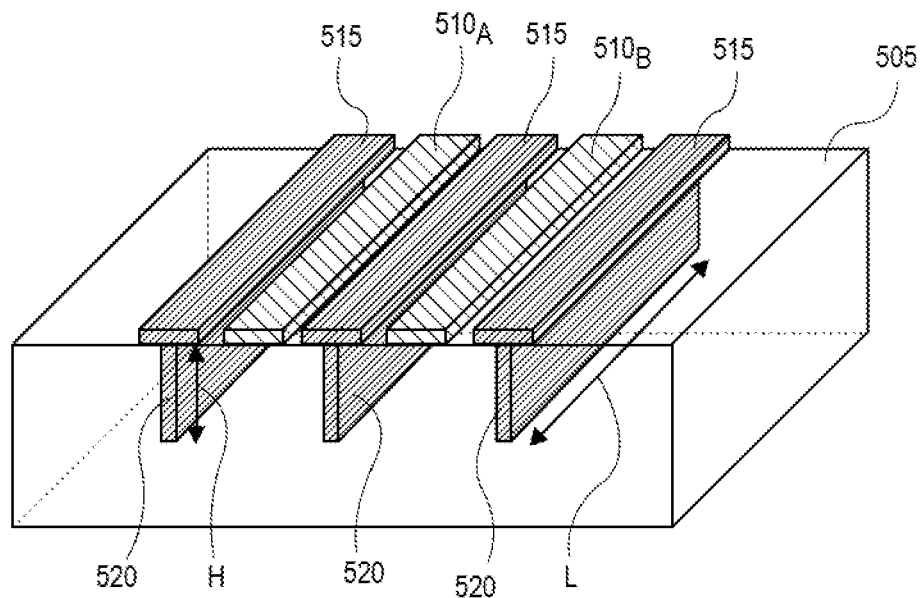
FIG. 5B is a perspective view illustration of the core in FIG. 5A that illustrates the ground planes extending substantially along a length of the ground traces, in accordance with an embodiment.

Referring now to FIG. 5A, a cross-sectional illustration of a core 505 with coplanar waveguides is shown, in accordance with an embodiment. In an embodiment, the core 505 may be substantially similar to the core 405 described in greater detail above. For example, the core 505 may be a glass core 505 in some embodiments. In an embodiment, the core 505 may have a thickness between approximately 100 µm and approximately 1,000 µm.

In an embodiment, a plurality of signal traces 510 may be in an alternating pattern with a plurality of ground traces 515. For example, signal trace $510_A$ may be separated from signal trace $510_B$ by a ground trace 515. The signal traces 510 and the ground traces 515 may have dimensions similar to the dimensions of the ground traces 415 and signal traces 410 described in greater detail above.

In an embodiment, a plurality of conductive via planes 520 may be provided into the core 505. The conductive via planes 520 may be blind structures formed with a laser-assisted etching process. As a blind structure, the via planes 520 do not extend entirely through a thickness of the core 505. In some embodiments, the via planes 520 may extend approximately half-way through a thickness of the core 505. The depth of the via planes 520 into the core 505 may be dependent on the depth of the electromagnetic field generated in the core 505. For example, the via planes 520 may extend to a depth that blocks substantially all of the electromagnetic field between the signal traces 510. Sidewalls of the via planes 520 may be sloped, as is characteristic of laser-assisted etching processes. In a particular embodiment, a cross-section of the via planes 520 may be a trapezoidal.

Referring now to FIG. 5B, a perspective view illustration of the core 505 is shown, in accordance with an embodiment. In FIG. 5B, sidewalls of the via planes 520 are shown as substantially vertical. However, it is to be appreciated that sidewalls of the via planes 520 may be sloped and/or the via planes 520 may have trapezoidal shaped cross-sections. The perspective view illustration more clearly depicts the length L of the via planes 520. The length L of the via planes 520 may be substantially equal to a length of the ground traces 515. That is, a continuous conductive via plane 520 is provided below each of the ground traces 515. Additionally, while straight lines are depicted in FIG. 5B, it is to be appreciated that turns along the ground trace 515 can be matched with turns in the via plane 520. The ability to provide such routing flexibility is provided by the laser-assisted etching process, since the laser can be moved in any pattern across the core 505. As shown in FIG. 5B, the via planes 520 have a height H that is less than a thickness of the core 505. The height H may be sufficient to block electromagnetic fields from the signal traces 510 that would otherwise result in unwanted cross-talk.

Figure 6A:
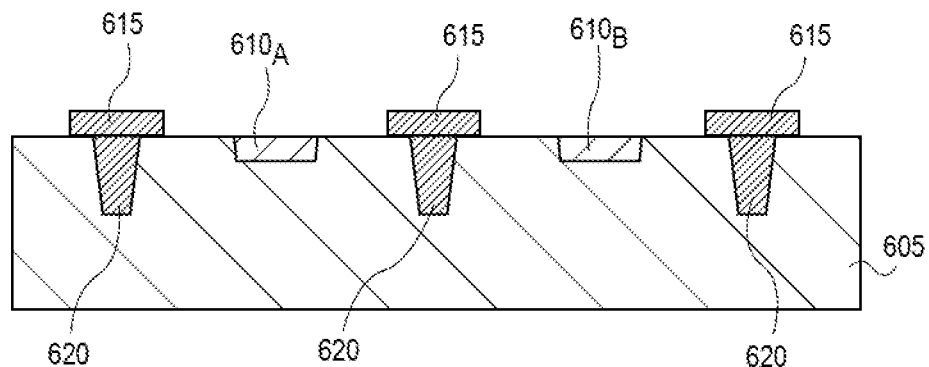
FIG. 6A is a cross-sectional illustration of a core with coplanar waveguides with signal traces embedded in the core, in accordance with an embodiment.

Referring now to FIG. 6A, a cross-sectional illustration of a core 605 is shown, in accordance with an embodiment. In an embodiment, the core 605 may be substantially similar to the core 505 in FIG. 5A. For example, the plurality of signal traces $610_A$ and $610_B$ may be in an alternating pattern with the ground traces 615. Additionally, ground via planes 620 may be provided below (and connected to) ground traces 615. The difference in FIG. 6A is the location of the signal traces $610_A$ and $610_B$.

Instead of being disposed on a top surface of the core 605, the signal traces $610_A$ and $610_B$ are embedded in the core 605. In an embodiment, the signal traces 610 may be formed with a laser-assisted etching process. As such, the signal traces 610 may have sloped sidewalls. For example, the signal traces 610 may have a trapezoidal cross-section. However, in other embodiments, the signal traces 610 may have substantially vertical sidewalls.

In an embodiment, the via planes 620 may extend into, but not through, a thickness of the core 605. The via planes 620 may have sloped sidewalls characteristic of a laser-assisted etching process. For example, the via planes 620 may have a cross-sectional shape that is trapezoidal.

Figure 6B:
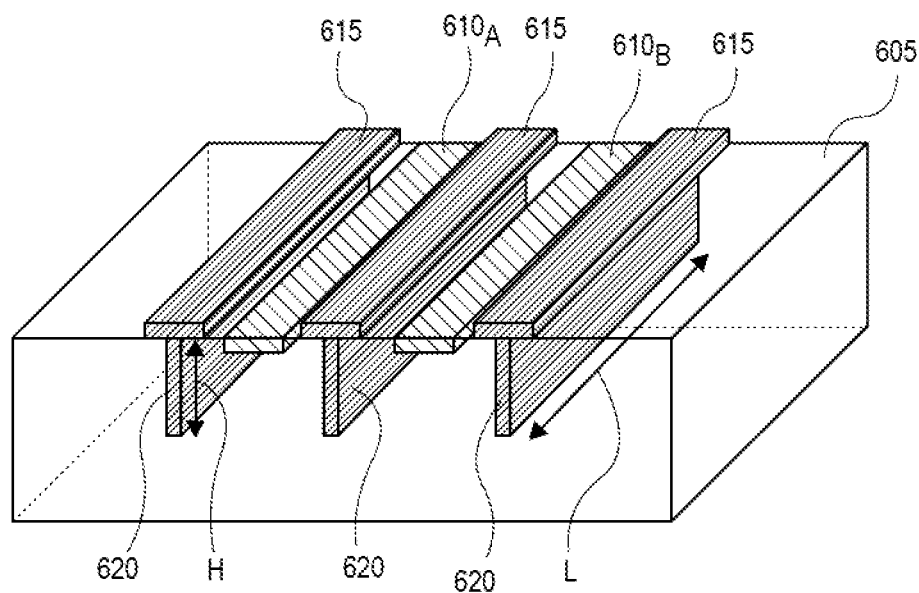
FIG. 6B is a perspective view illustration of the core in FIG. 6A, in accordance with an embodiment.

Referring now to FIG. 6B, a perspective view illustration of the core 605 is shown, in accordance with an embodiment. Similar to the core 505 in FIG. 5B, the via planes 620 have a height H that is less than a thickness of the core 605. The via planes 620 may also extend a length L that is substantially equal to a length of the ground traces 615. As such, a continuous via plane 620 is provided between neighboring signal traces 610 in order to mitigate cross-talk.

Figure 6C:
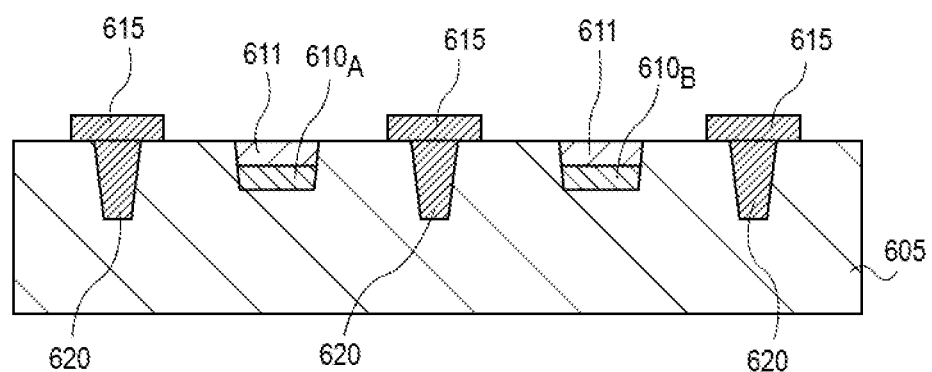
FIG. 6C is a cross-sectional illustration of a core with coplanar waveguides with signal traces embedded in the core and covered by a dielectric plug, in accordance with an embodiment.

Referring now to FIG. 6C, a cross-sectional illustration of a core 605 is shown, in accordance with an additional embodiment. The core 605 in FIG. 6C is substantially similar to the core 605 in FIG. 6A, with the exception of the signal traces $610_A$ and $610_B$ being fully embedded. Instead of having a top surface exposed (i.e., coplanar with a top surface of the core 605, as shown in FIG. 6A), the top surface of the signal traces 610 are recessed below a top surface of the core 605. The top surfaces of the signal traces 610 may be covered by a dielectric plug 611. The dielectric plug 611 may be a different material than the core 605. In other embodiments, the dielectric plug 611 may be part of the core 605.

In FIGS. 4A-6C the cores are illustrated in isolation. That is, no buildup layers are shown above and/or below the cores. However, it is to be appreciated that package substrates may comprise the core with buildup layers above and/or below the core. An example of a core with buildup layers is shown in FIG. 7A.

Figure 7A:
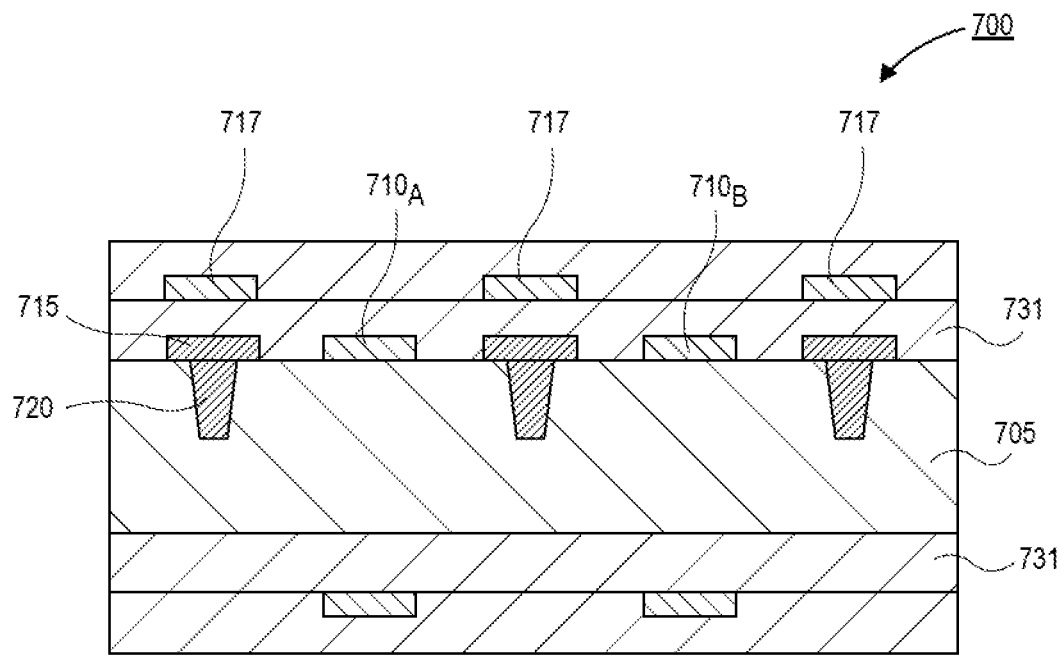
FIG. 7A is a cross-sectional illustration of an electronic package with coplanar waveguides on a core of the electronic package, and with signal traces in a buildup layer over ground traces, in accordance with an embodiment.

Referring now to FIG. 7A, a cross-sectional illustration of an electronic package 700 is shown, in accordance with an embodiment. In an embodiment, the electronic package 700 comprises a core 705. The core 705 may be substantially similar to the core 505 in FIG. 5A. For example, signal traces $710_A$ and $710_B$ may be separated by ground traces 715 that are over via planes 720. In the illustrated embodiment, the via planes 720 do not extend entirely through a thickness of the core 705. In other embodiments, the via planes 720 may extend through a thickness of the core 705.

In an embodiment, buildup layers 731 are provided above and below the core 705. In the illustrated embodiment a pair of buildup layers 731 are provided over each surface of the core 705. However, other embodiments may include any number of buildup layers 731. As shown in FIG. 7A, additional signal traces 717 may be provided in the buildup layers 731. In a particular embodiment, the additional signal traces 717 may be positioned directly above the ground traces 715 in a second buildup layer 731.

Figure 7B:
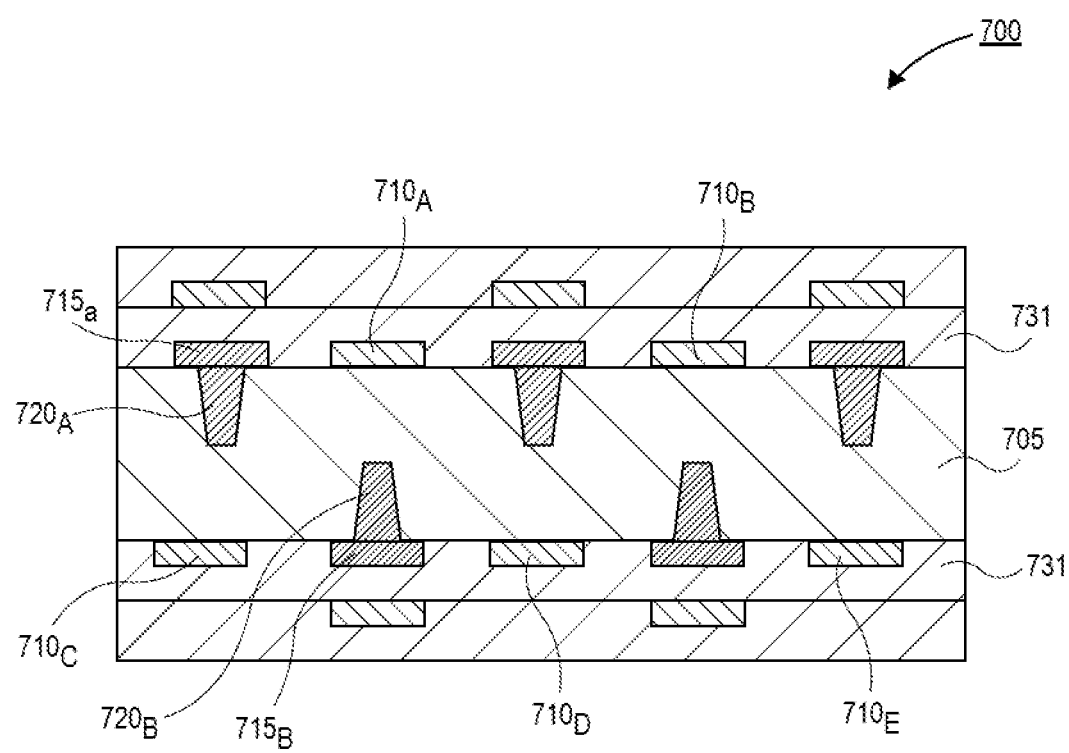
FIG. 7B is a cross-sectional illustration of an electronic package with coplanar waveguides on both surfaces of the core, in accordance with an embodiment.

Referring now to FIG. 7B, a cross-sectional illustration of an electronic package 700 is shown, in accordance with an embodiment. In an embodiment the electronic package 700 in FIG. 7B is substantially similar to the electronic package 700 in FIG. 7A, with the exception of the addition of additional coplanar waveguides on the bottom surface of the core 705. As shown, signal traces $710_C$-$710_E$ are provided on the bottom surface of the core 705. The signal traces $710_C$-$710_E$ may be positioned below ground traces $715_A$ and via planes $720_A$ that extend down from the top surface of the core 705. Ground traces $715_B$ and via planes $720_B$ that extend up from the bottom surface of the core 705 may separate each of the signal traces $710_C$-$710_E$. The ground traces $715_B$ and via planes $720_B$ may be positioned below signal traces $710_A$ and $710_B$.

Figure 8:
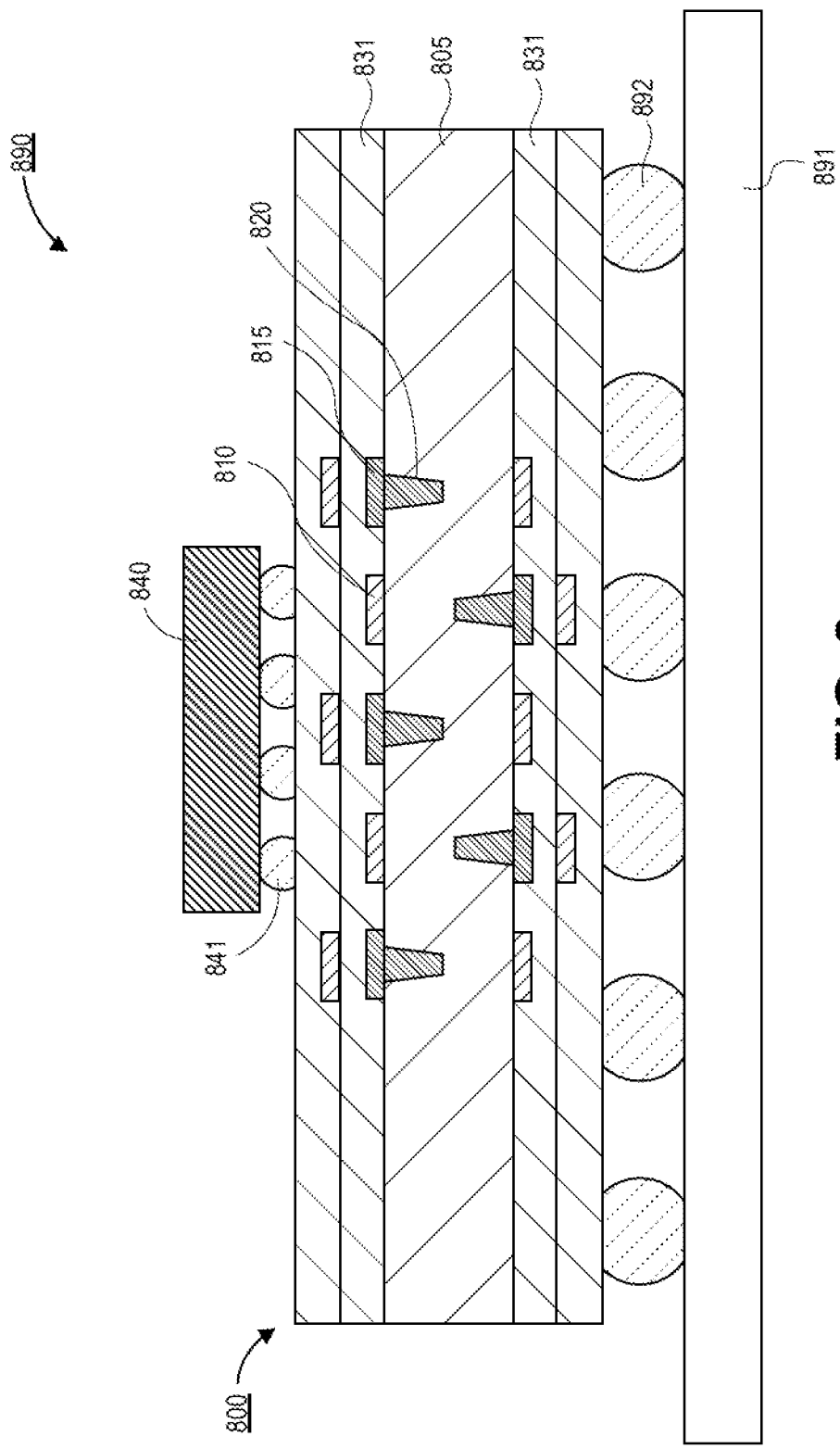
FIG. 8 is a cross-sectional illustration of an electronic system with a package core that comprises a coplanar waveguide with a ground plane below the ground traces, in accordance with an embodiment.

Referring now to FIG. 8, a cross-sectional illustration of an electronic system 890 is shown, in accordance with an embodiment. In an embodiment, the electronic system 890 comprises a board 891, such as a printed circuit board (PCB). In an embodiment, the board 891 is coupled to a package substrate 800 by interconnects 892. The interconnects 892 may be solder balls, sockets, or the like.

In an embodiment, the package substrate 800 comprises a core 805 and buildup layers 831. Coplanar waveguides may be provided on one or both surfaces of the core 805. For example, each coplanar waveguide comprises a signal trace 810 that is bordered by ground traces 815. Via planes 820 may extend into the core 805 from the ground traces 815. While a core 805 with coplanar waveguides similar to the embodiment shown in FIG. 7B is illustrated in FIG. 8, it is to be appreciated that any of the core and coplanar waveguide configurations disclosed herein may be used in the electronic system 890.

In an embodiment, a die 840 may be coupled to the package substrate 800 by first level interconnects (FLIs) 841. The FLIs 841 may be solder balls, copper pillars, or any other suitable FLI architecture. In an embodiment, the die 840 may be a processor, a system on a chip (SoC), a graphics processor, a memory, or any other type of die.

Figure 9:
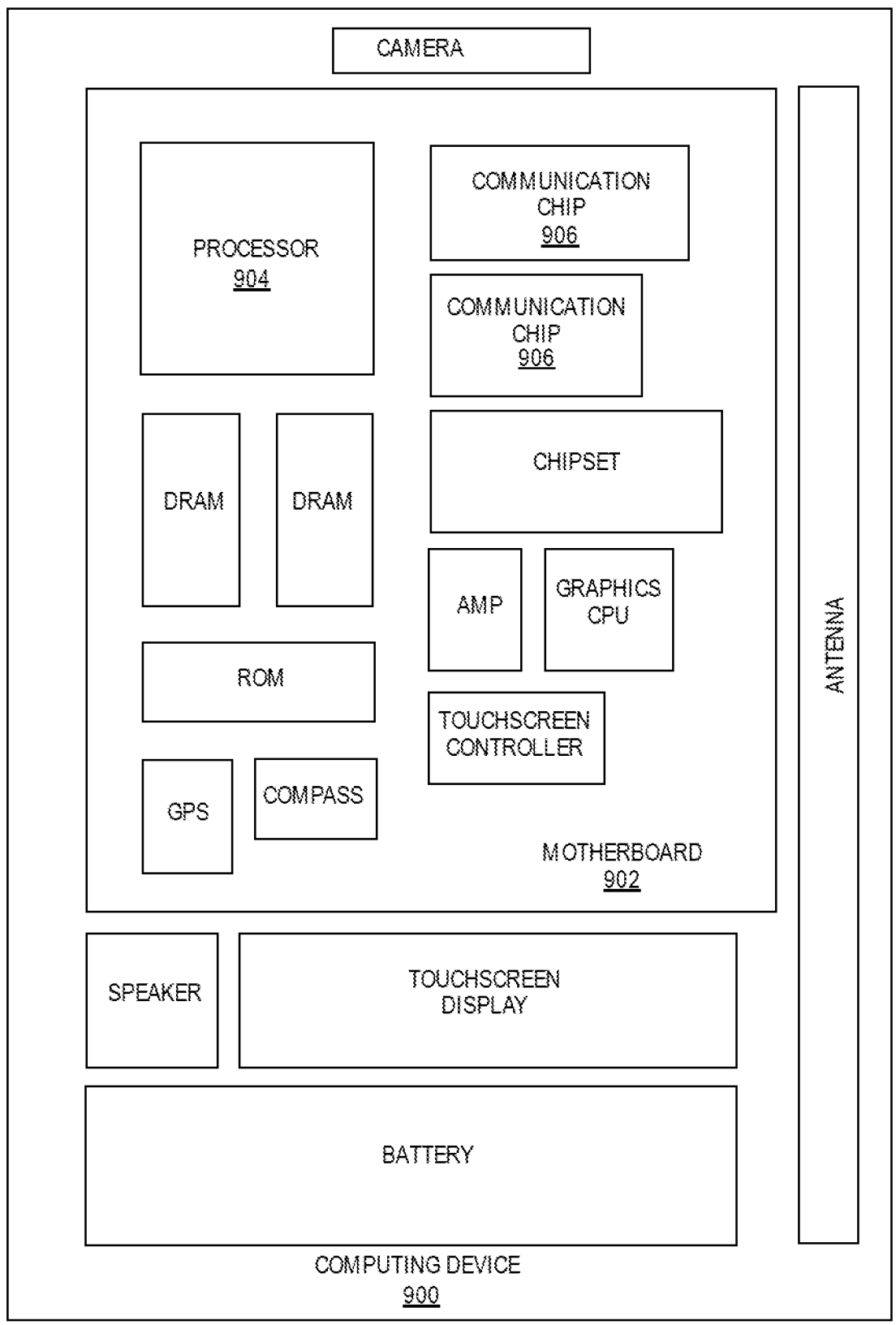
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be part of an electronic package that comprises a core with coplanar waveguides that include via planes below the ground traces, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be part of an electronic package that comprises a core with coplanar waveguides that include via planes below the ground traces, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a coplanar waveguide, comprising: a core; a signal trace on the core, wherein the signal trace has a first edge and a second edge; a first ground trace over the core, wherein the first ground trace is adjacent to the first edge of the signal trace; a first ground via plane below the first ground trace; a second ground trace over the core, wherein the second ground trace is adjacent to the second edge of the signal trace; and a second ground via plane below the second ground trace.

Example 2: the coplanar waveguide of Example 1, wherein the first ground via plane and the second ground via plane extend through an entire thickness of the core.

Example 3: the coplanar waveguide of Example 1, wherein the first ground via plane and the second ground via plane extend partially through a thickness of the core.

Example 4: the coplanar waveguide of Examples 1-3, wherein sidewalls of the first ground via plane and the second ground via plane are sloped.

Example 5: the coplanar waveguide of Example 4, wherein the first ground via plane and the second ground via plane have hourglass shaped cross-sections.

Example 6: the coplanar waveguide of Examples 1-5, further comprising: a second signal trace over the core, wherein the first ground trace and the first ground via plane are between the signal trace and the second signal trace.

Example 7: the coplanar waveguide of Examples 1-6, wherein the first ground via plane and the second ground via plane have a first width, wherein the first width is approximately 20 µm or smaller.

Example 8: the coplanar waveguide of Examples 1-7, wherein the first ground trace and the signal trace are separated from each other by a first space, wherein the first space is approximately 50 µm or smaller.

Example 9: the coplanar waveguide of Examples 1-8, wherein a length of the first ground trace is substantially equal to a length of the first ground via plane.

Example 10: the coplanar waveguide of Examples 1-9, wherein the core is a glass core.

Example 11: the coplanar waveguide of Examples 1-10, further comprising: a buildup layer over the core; and a second signal trace over the buildup layer and directly above the first ground trace.

Example 12: the coplanar waveguide of Examples 1-11, wherein the signal trace is embedded in the core.

Example 13: the coplanar waveguide of Example 12, wherein a dielectric material is provided over the signal trace.

Example 14: an electronic package, comprising: a core; a plurality of signal traces on the core; a plurality of ground traces on the core, wherein individual ones of the plurality of the signal traces are alternated with individual ones of the plurality of the ground traces; a plurality of ground via planes, wherein individual ones of the plurality of ground via planes are provided below, and in contact with, individual ones of the plurality of ground traces.

Example 15: the electronic package of Example 14, further comprising: a second plurality of ground traces, wherein the second plurality of ground traces are on a surface of the core opposite from the plurality of ground traces; and a second plurality of ground via planes, wherein individual ones of the plurality of ground via planes are provided above, and in contact with, individual ones of the second plurality of ground traces.

Example 16: the electronic package of Example 15, wherein individual ones of the second plurality of ground traces are positioned below individual ones of the plurality of signal traces.

Example 17: the electronic package of Example 15 or Example 16, wherein the plurality of ground via planes and the second plurality of ground via planes extend partially through a thickness of the core.

Example 18: the electronic package of Examples 14-17, wherein the plurality of signal traces are embedded in the core.

Example 19: the electronic package of Example 18, wherein dielectric plugs are provided above individual ones of the plurality of signal traces.

Example 20: the electronic package of Examples 14-19, wherein the plurality of ground via planes extend through an entire thickness of the core.

Example 21: the electronic package of Examples 14-19, wherein the plurality of ground via planes extend partially through a thickness of the core.

Example 22: the electronic package of Examples 14-21, wherein the core is a glass core.

Example 23: an electronic system, comprising: a board; a package substrate coupled to the board, wherein the package substrate comprises: a core; a signal trace on the core, wherein the signal trace has a first edge and a second edge; a first ground trace over the core, wherein the first ground trace is adjacent to the first edge of the signal trace; a first ground via plane below the first ground trace; a second ground trace over the core, wherein the second ground trace is adjacent to the second edge of the signal trace; and a second ground via plane below the second ground trace; and a die coupled to the package substrate.

Example 24: the electronic system of Example 23, wherein the first ground via plane and the second ground via plane extend through an entire thickness of the core.

Example 25: the electronic system of Example 23, wherein the first ground via plane and the second ground via plane extend partially through a thickness of the core.

What is claimed is:

1. A coplanar waveguide, comprising:
   a core;
   a signal trace on the core, wherein the signal trace has a first edge and a second edge;
   a first ground trace over the core, wherein the first ground trace is adjacent to the first edge of the signal trace;
   a first ground via plane below the first ground trace, the first ground via plane extending substantially along a length of the first ground trace;
   a second ground trace over the core, wherein the second ground trace is adjacent to the second edge of the signal trace;
   a second ground via plane below the second ground trace, the second ground via plane extending substantially along a length of the second ground trace;
   a buildup layer over the core; and
   a second signal trace over the buildup layer and directly above the first ground trace.

2. The coplanar waveguide of claim 1, wherein the first ground via plane and the second ground via plane extend through an entire thickness of the core.

3. The coplanar waveguide of claim 1, wherein the first ground via plane and the second ground via plane extend partially through a thickness of the core.

4. The coplanar waveguide of claim 1, wherein sidewalls of the first ground via plane and the second ground via plane are sloped.

5. The coplanar waveguide of claim 4, wherein the first ground via plane and the second ground via plane have hourglass shaped cross-sections.

6. The coplanar waveguide of claim 1, further comprising:
   a second signal trace over the core, wherein the first ground trace and the first ground via plane are between the signal trace and the second signal trace.

7. The coplanar waveguide of claim 1, wherein the first ground via plane and the second ground via plane have a first width, wherein the first width is approximately 20 µm or smaller.

8. The coplanar waveguide of claim 1, wherein the first ground trace and the signal trace are separated from each other by a first width, wherein the first width is approximately 50 µm or smaller.

9. The coplanar waveguide of claim 1, wherein a length of the first ground trace is substantially equal to a length of the first ground via plane.

10. The coplanar waveguide of claim 1, wherein the core is a glass core.

11. The coplanar waveguide of claim 1, wherein the signal trace is embedded in the core.

12. The coplanar waveguide of claim 11, wherein a dielectric material is provided over the signal trace.

13. An electronic package, comprising:
    a core;
    a plurality of signal traces on the core;
    a plurality of ground traces on the core, wherein individual ones of the plurality of the signal traces are alternated with individual ones of the plurality of the ground traces;
    a plurality of ground via planes, wherein individual ones of the plurality of ground via planes are provided below, and in contact with, corresponding individual ones of the plurality of ground traces, and wherein the individual ones of the plurality of ground via planes extend substantially along a length of the corresponding individual ones of the plurality of ground traces;
    a second plurality of ground traces, wherein the second plurality of ground traces are on a surface of the core opposite from the plurality of ground traces; and
    a second plurality of ground via planes, wherein individual ones of the plurality of ground via planes are provided above, and in contact with, individual ones of the second plurality of ground traces.

14. The electronic package of claim 13, wherein individual ones of the second plurality of ground traces are positioned below individual ones of the plurality of signal traces.

15. The electronic package of claim 13, wherein the plurality of ground via planes and the second plurality of ground via planes extend partially through a thickness of the core.

16. The electronic package of claim 13, wherein the plurality of signal traces are embedded in the core.

17. The electronic package of claim 16, wherein dielectric plugs are provided above individual ones of the plurality of signal traces.

18. The electronic package of claim 13, wherein the plurality of ground via planes extend through an entire thickness of the core.

19. The electronic package of claim 13, wherein the plurality of ground via planes extend partially through a thickness of the core.

20. The electronic package of claim 13, wherein the core is a glass core.

21. An electronic system, comprising:
- a board;
- a package substrate coupled to the board, wherein the package substrate comprises:
  - a core;
  - a signal trace on the core, wherein the signal trace has a first edge and a second edge;
  - a first ground trace over the core, wherein the first ground trace is adjacent to the first edge of the signal trace;
  - a first ground via plane below the first ground trace, the first ground via plane extending substantially along a length of the first ground trace;
  - a second ground trace over the core, wherein the second ground trace is adjacent to the second edge of the signal trace;
  - a second ground via plane below the second ground trace;
  - a buildup layer over the core; and
  - a second signal trace over the buildup layer and directly above the first ground trace; and
- a die coupled to the package substrate, the second ground via plane extending substantially along a length of the second ground trace.

22. The electronic system of claim 21, wherein the first ground via plane and the second ground via plane extend through an entire thickness of the core.

23. The electronic system of claim 21, wherein the first ground via plane and the second ground via plane extend partially through a thickness of the core.

24. An electronic package, comprising:
- a core;
- a plurality of signal traces on the core;
- a plurality of ground traces on the core, wherein individual ones of the plurality of the signal traces are alternated with individual ones of the plurality of the ground traces; and
- a plurality of ground via planes, wherein individual ones of the plurality of ground via planes are provided below, and in contact with, corresponding individual ones of the plurality of ground traces, and wherein the individual ones of the plurality of ground via planes extend substantially along a length of the corresponding individual ones of the plurality of ground traces, wherein the plurality of signal traces are embedded in the core, and wherein dielectric plugs are provided above individual ones of the plurality of signal traces.

* * * * *